(12) United States Patent
Mohan et al.

(10) Patent No.: US 6,536,023 B1
(45) Date of Patent: Mar. 18, 2003

(54) METHOD AND SYSTEM FOR HIERARCHICAL METAL-END, ENCLOSURE AND EXPOSURE CHECKING

(75) Inventors: Muni B. S. Mohan, San Jose; Kevin E. Moynihan, Los Altos, both of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/609,459

(22) Filed: Jul. 3, 2000

(51) Int. Cl.⁷ ............................................... G06F 17/50
(52) U.S. Cl. ......................................................... 716/5
(58) Field of Search ................. 716/1, 2, 4, 5

(56) References Cited

U.S. PATENT DOCUMENTS

| | | | | |
|---|---|---|---|---|
| 5,581,475 A | * | 12/1996 | Majors | 364/491 |
| 5,812,415 A | * | 9/1998 | Baisuck | 364/490 |
| 6,275,971 B1 | * | 8/2001 | Levy et al. | 716/5 |

OTHER PUBLICATIONS

Pleskacz et al., "A DRC–Based Algorithm for Extraction of Critical Areas for Opens in Large VLSI Circuits," IEEE Trans. on CAD of ICs and Systems, vol. 18, No. 2, Feb. 1999, pp. 151–162.*

Jeppson et al., "Formal Definitions of Edge–Based Geometric Design Rules," IEEE Trans. on CAD of ICs and Systems, vol. 12, No. 1, Jan. 1993, pp. 59–69.*

Jeppson et al. "Formal Definitions of Edge–Based Geometric Design Rules," IEEE Trans. On CAD of Ics and Systems, vol. 12, No. 1, Jan. 1993, pp. 59–60.

* cited by examiner

Primary Examiner—Nathan J. Flynn
Assistant Examiner—Leigh Marie Garbowski
(74) Attorney, Agent, or Firm—Lyon & Lyon LLP (57) ABSTRACT

An automated design rule checking software system processes a physical layout file of a circuit design to derive a list of vias needing design rule checks for violations in metal end, enclosure and/or exposure design rules. The process involves selection of vias likely to cause design rule check problems, selection of vias that violate an enclosure design rule, selection of vias violate metal end design rules, and design rule checks on the selected vias. Potentially problematic vias may be identified by expanding the dimensions of existing vias by a first predetermined minimum distance, subtracting out the metal area, and identifying those vias with residual portions remaining as potentially problematic vias. Candidate vias for an enclosure design rule check may be identified by expanding the dimensions of potentially problematic vias by a second predetermined minimum distance, subtracting out the metal area, and identifying those vias with residual portions remaining as violating the enclosure design rules. Candidate vias for a metal end design rule check may be identified by expanding the dimensions (excluding the corner regions) of potentially problematic vias by the first predetermined minimum distance, substracting out the metal area, and identifying those vias with residual portions remaining as violating the metal end design rules.

21 Claims, 10 Drawing Sheets

METHOD AND SYSTEM FOR HIERARCHICAL METAL-END, ENCLOSURE AND EXPOSURE CHECKING

BACKGROUND OF THE INVENTION

1. Field of the Invention

The field of the present invention relates to electronic design automation and, more particularly, to methods and systems for conducting metal-end, enclosure, and exposure checks of vias through an electronic design automation procedure.

2. Background

Chip designers often use electronic design automation (EDA) software tools to assist in the design process, and to allow simulation and verification of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's specifications). The placement and routing software routines generally accept as their input a flattened netlist that has been generated by the logic synthesis process. This flattened netlist identifies the specific logic cell instances from a target standard cell library, and describes the specific cell-to-cell connectivity. After this specific cell-to-cell connectivity has been established, the physical design and layout software creates a physical layout file of the integrated circuit, including the physical position of each metal line (i.e., wire) and each via (i.e., metal transition between chip layers). As a last step before creation of the mask file for delivery to the fabrication facility, the physical verification and layout validation software performs several design rule checks (DRCs) on the layout file. Collectively, these DRCs constitute what is generally referred to in the industry as the "Rule Deck."

During the design rule checks contained in the Rule Deck, the physical layout file generally must be checked for correct relative positioning of vias and metal lines. For example, to ensure adequate contact between vias and metal lines (when a conductive path between the via and metal line is called for), minimum overlap distances are required which dictate the extent to which the metal must extend beyond each via. These minimum overlap distances often vary depending on the shape of the metal surrounding the via. As another example of a design rule check, certain minimum distances are required between vias and metal ends, so as to reduce the likelihood of short circuits or other similar problems in the final product. Metal ends are generally defined as the terminating edge(s) or point(s) of metal lines. Minimum distances are also required for vias enclosed by metal (also referred to as vias at enclosures). Enclosures are generally defined as connection points between vias and metal, which are not at a metal end (i.e., where the footprint of the via on the metal is near no more than two metal edges). Another design rule check relates to exposure, whereby a determination is made as to whether all or part of a via is exposed, i.e., not covered by metal.

In conventional techniques, all vias are checked by design rules checks (DRCs) which are part of the Rule Deck. As part of these procedures, for each metal end, the distance from each point at the edge of the metal end to each via is calculated to ensure that minimum distances are met. The calculations required by these procedures easily number in the millions. Many of these calculations are unnecessary, however, because they are performed on vias that are obviously far from metal edges. As a result, a great deal of processing time is wasted.

Accordingly, the inventors have determined that it would be advantageous to provide an intelligent selection of which vias should have the complete design rule checks performed on them, while screening out vias that do not require a complete set of design rule checks.

SUMMARY OF THE INVENTION

The invention provides in one aspect systems and methods for selecting a subset or subsets of vias on which to perform metal end, enclosure and exposure checks.

In a preferred embodiment, an automated design rule checking software system receives as an input a physical layout file for a circuit design. The automated design rule checking software system outputs a list of vias needing design rule checks for violations in up to three categories: metal end, enclosure and exposure.

In one or more embodiments, an automated process selects vias from a physical layout file likely to cause design rule check problems, from among all of the vias in the physical layout file. The process then selects those vias that violate the enclosure rule and performs a design rule check for enclosure violations on the identified vias; performs a design rule check for metal end violations on the potentially problematic vias; and performs an exposure check on the potentially problematic vias.

Potentially problematic vias may be identified by expanding the dimensions of existing vias by a first predetermined minimum distance, subtracting out the metal area, and identifying those vias with residual portions remaining as potentially problematic vias. Candidate vias for an enclosure design rule check may be identified by expanding the dimensions of potentially problematic vias by a second predetermined minimum distance, subtracting out the metal area, and identifying those vias with residual portions remaining as violating the enclosure design rules. Candidate vias for a metal end design rule check may be identified by expanding the dimensions (excluding the corner regions) of potentially problematic vias by the first predetermined minimum distance, subtracting out the metal area, and identifying those vias with residual portions remaining as violating the metal end design rules.

Further embodiments, modifications, variations and enhancements are also described herein.

DETAILED DESCRIPTION OF PREFERRED EMBODIMENTS

Preferred embodiments will now be described, with reference as necessary to the accompanying drawings. First, however, additional general background information is provided concerning electronic design automation (EDA) software tools.

Figure 1:
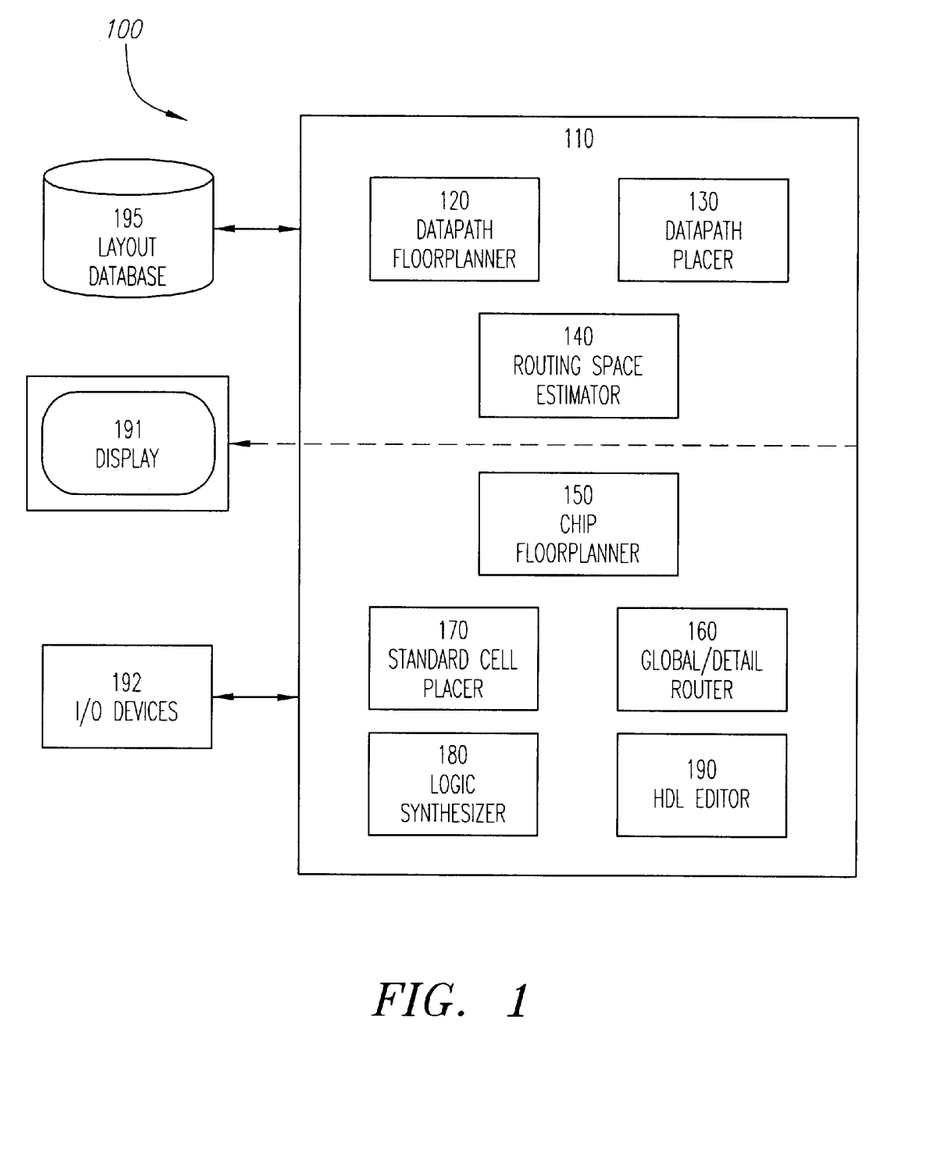
FIG. 1 is a diagram of a computer system that may be used in connection with various embodiments of the invention as described herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath floorplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™ (or DesignPlanner™), Synergy™ (or BuildGates™), and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

As explained previously herein, chip designers generally use a top-down design methodology, starting with hardware description languages (HDLs), such as Verilog® or VHDL, for example, to create an integrated circuit by hierarchically defining functional components of the circuit, and then decomposing each component into smaller and smaller components. Two of the primary types of components used in digital integrated circuits are datapaths and control logic. Control logic, typically random logic, is used to control the operations of datapaths. Datapath areas of the circuit perform functional operations, such as mathematical or other operations.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description, as previously mentioned in the Background section hereof, the actual logic cell implementation is typically determined by logic synthesis, which converts the functional description of the circuit into a specific circuit implementation. The logic cells are then placed and routed, resulting in a physical layout file.

Further explanation of a particular chip design process is set forth, for example, in U.S. Pat. No. 5,838,583, hereby incorporated by reference as if set forth fully herein.

Figure 2:
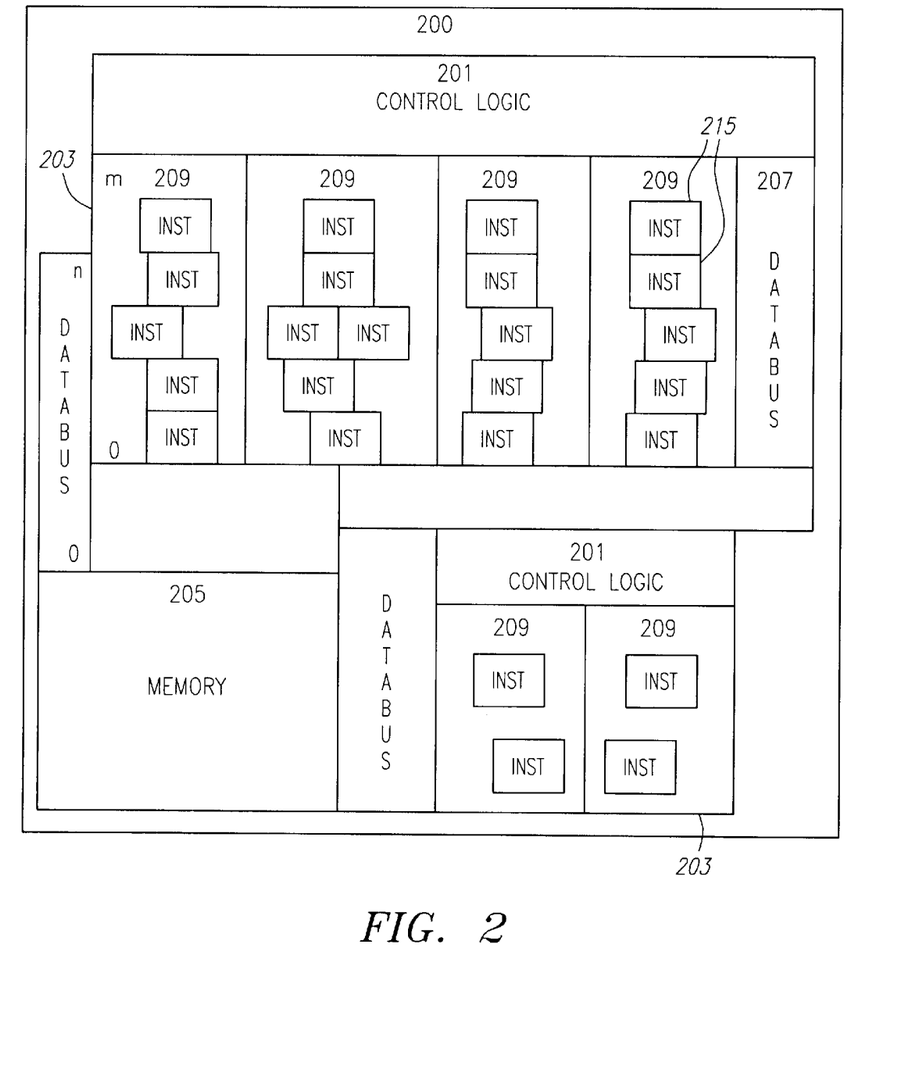
FIG. 2 is a diagram of a simplified integrated circuit as may be generated using a computer system such as shown in FIG. 1.

Referring now to FIG. 2, there is shown a schematic illustration of a simplified integrated circuit 200 that may be represented by circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 209 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances or, more generally, by associating the inputs and outputs of a number of instances.

Figure 3:
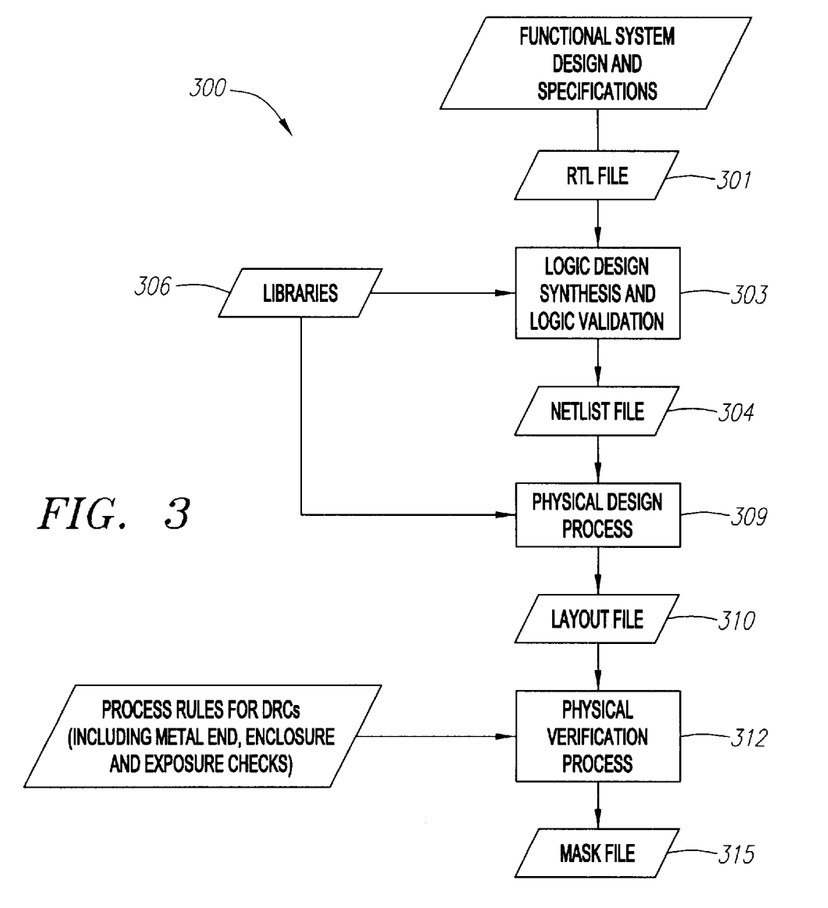
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The component library 306 is utilized in this process stage in order to obtain information concerning the sizes of gates and other components that may be present in the netlist file 304.

From the layout file 310, a physical verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

Figure 4:
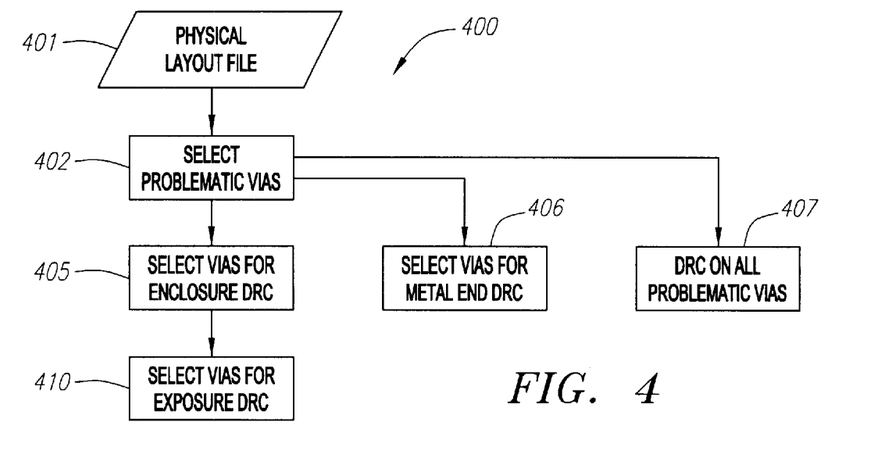
FIG. 4 is a process flow diagram in accordance with a preferred metal end, enclosure and exposure checking process as disclosed herein.

In various embodiments as disclosed herein, a process is provided for selecting design rule checks for specific vias, that may be used in conjunction with the verification process 312 illustrated in FIG. 3. FIG. 4 is a diagram of a process flow for selecting and processing vias that are likely to have metal end, enclosure and/or exposure violations. These vias will generally be referred to as "potentially problematic vias" herein.

Figure 19:
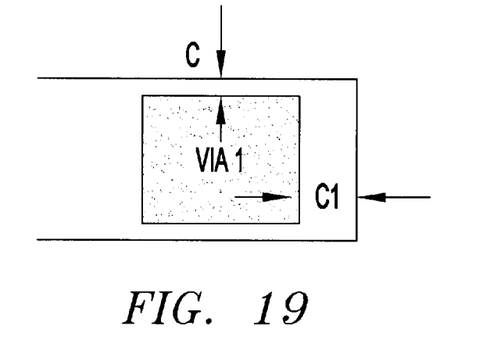
FIGS. 19, 20 and 21 are diagrams of vias in relation to metal wires or metal areas, illustrating examples of minimum distances between the via and the edge of the metal.
Figure 20:
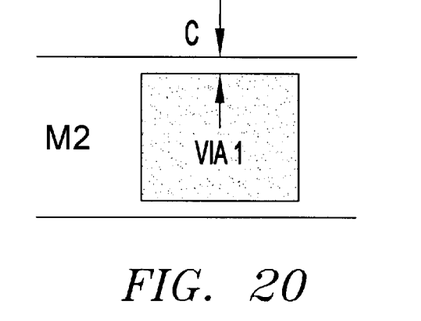

The various types of problematic vias may be explained with reference to FIGS. 19, 20 and 21. Metal end type vias are located at the end of metal lines, such as illustrated in FIG. 19. A certain minimum distance is required between the footprint of the via and the "terminating" end of the metal line, and this minimum distance is indicated by C1 in FIG. 19. A certain minimum distance is also required between the footprint of the via and the metal edge, and this minimum distance is indicated by C in FIG. 19. Enclosure type vias are those vias which are not at the end of metal lines, such as illustrated in FIG. 20. An enclosure type via may be next to two metal edges (but not in a corner), as illustrated by FIG. 20, but may also be located next to a single metal edge, or no metal edges. A minimum distance between the footprint of the via and the metal edge is generally required (which may be the same minimum distance as is required between a metal end via and a metal edge), and is marked C in FIG. 20.

Figure 21:
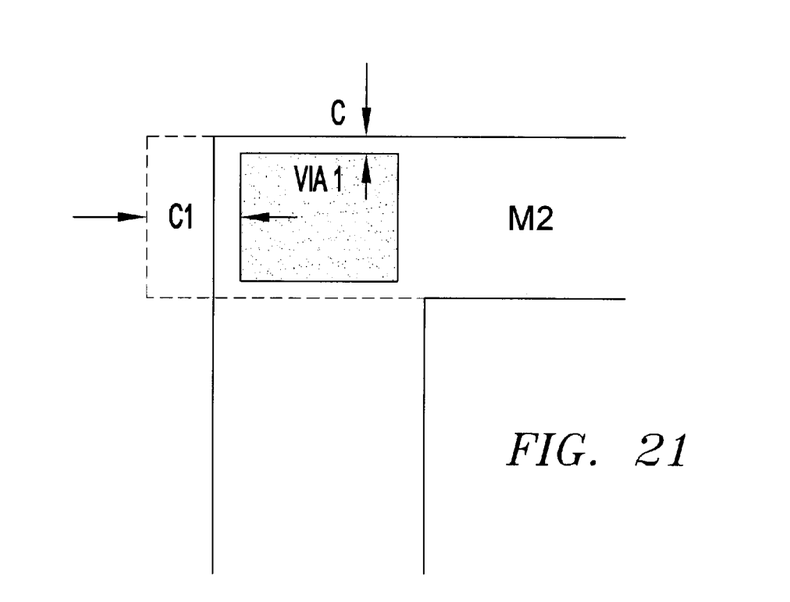

In certain embodiments described herein, vias positioned at corners of metal lines, as illustrated in FIG. 21, may be treated in a hybrid manner. For example, one of the sides of the via that is adjacent to the metal edge may be treated as though it was located at a metal end, while the other side of the via that is adjacent to a metal edge may be treated as an enclosure via. Thus, such vias at corners of metal lines may have two spacing requirements, one defined by a minimum distance C (from edge of the via to metal edge) and the other defined by a minimum distance C1 (from edge of the via to "terminating" edge of a metal end).

As illustrated in FIG. 4, a preferred process 400 for hierarchical metal-end, enclosure and/or exposure checking includes a step 402 for selecting potentially problematic vias from a physical layout file 401, preferably in accordance with techniques described later herein (and illustrated, e.g., with respect to FIG. 5). After step 402, one or more of steps 405, 406, 407 and 410 may be conducted. In step 405, vias are selected for an enclosure design rule check, preferably based upon criteria set forth further herein (and illustrated, e.g., with respect to FIG. 6). In step 410, vias are selected for an exposure design rule check, preferably according to criteria set forth further herein. In step 406, vias are selected for a metal end design rule check, preferably based upon criteria set forth further herein (and illustrated, e.g., with respect to FIG. 7). In step 407, design rule checks are performed on all potentially problematic vias, while preferably avoiding design rule checks for non-problematic vias.

Figure 5:
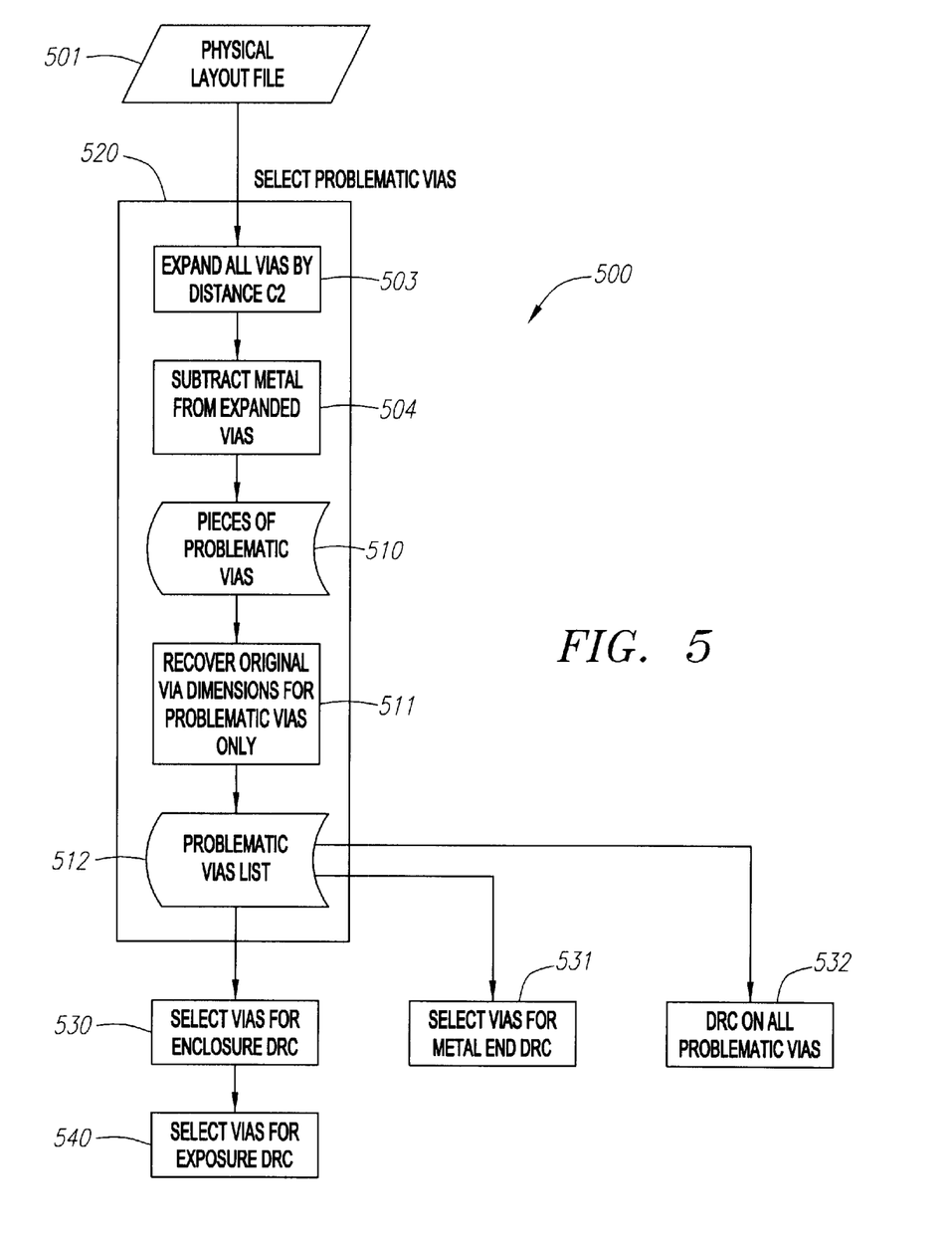
FIG. 5 is a process flow diagram in accordance with a preferred metal end, enclosure and exposure checking process as disclosed herein, showing specific steps for selecting potentially problematic vias, in general accordance with the process of FIG. 4.

FIG. 5 illustrates a preferred sub-process 520 for selecting potentially problematic vias, in connection with a preferred process 500 for selecting and processing vias that are likely to have metal end, enclosure and/or exposure violations. In one aspect, sub-process 520 may be viewed as filtering out vias that are not likely to be problematic, leaving those vias that are potentially problematic. In particular, the sub-process 520 selects only those vias that are within a certain minimum distance, C1, of an edge of the metal area. As illustrated in FIG. 5, sub-process 520 for selecting problematic vias includes, first, a step 503 whereby each via is systematically "expanded" in each direction by a predetermined expansion distance, in order to determine which vias are close to metal borders. This expansion is illustrated graphically in FIG. 8, wherein the original vias 800 are expanded by the predetermined expansion distance C1 to expanded vias 830. In one aspect, the predetermined expansion distance C1 represents a selected minimum distance which the via should be from a metal edge or termination point. The predetermined expansion distance may be selected by the design engineer based upon, for example, the particular manufacturing requirements of the foundry.

Figures 8, 9, 10:
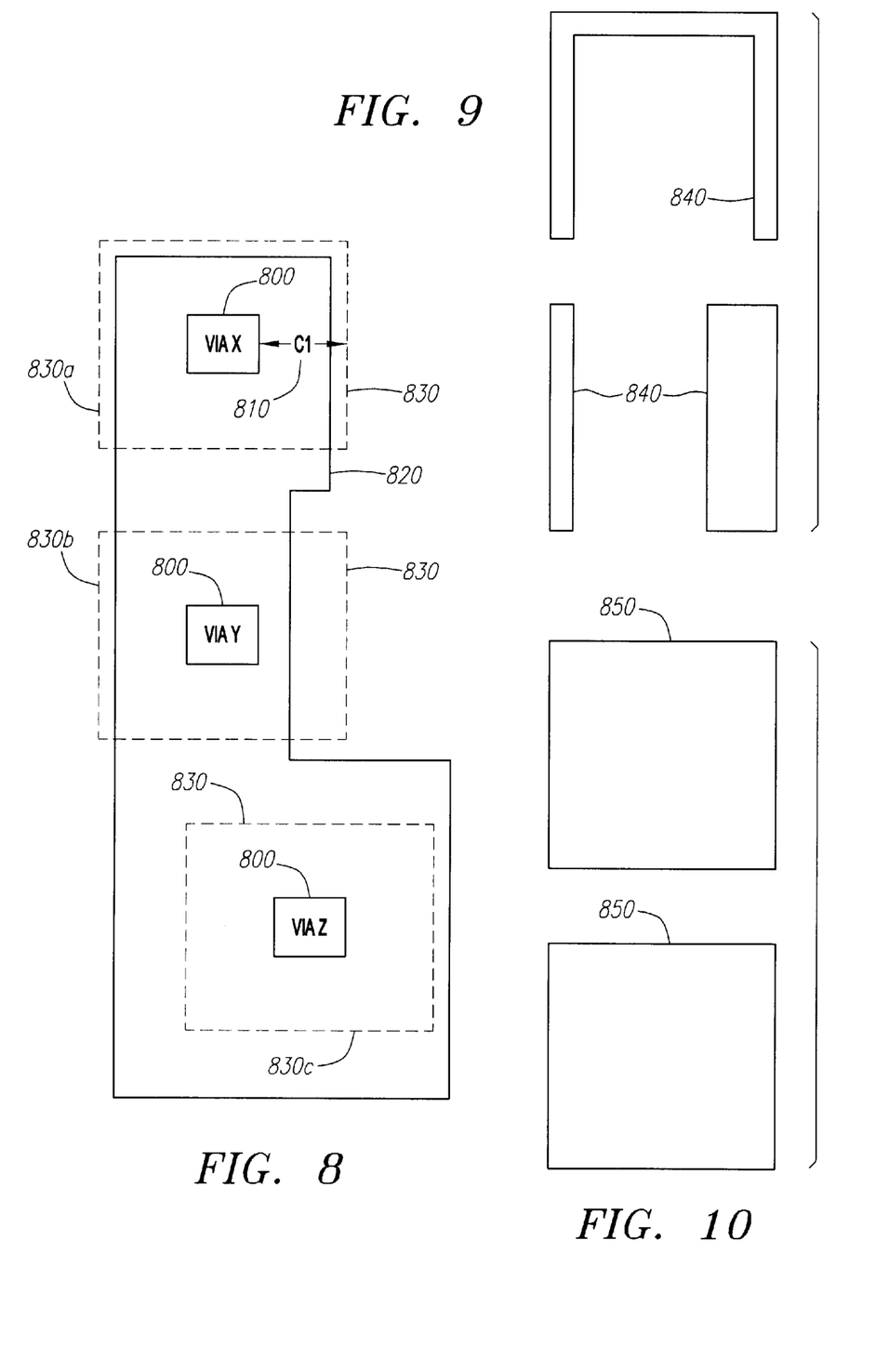
FIG. 8 is a diagram illustrating an example portion of a physical layout design, with vias extended by a distance C1.
FIG. 9 is a diagram illustrating the extended vias of FIG. 8, with a metal area subtracted.
FIG. 10 is a diagram illustrating only the selected problematic vias from FIG. 8, returned to their extended dimensions before subtraction of the metal area.

In a next step 504, the metal area 820 shown in FIG. 8 is subtracted from the area of the expanded vias 830, leaving only those residual portions 840 (see FIG. 9) of the expanded vias 830 that remain outside the metal area 820.

Figures 11, 12, 13, 14, 15:
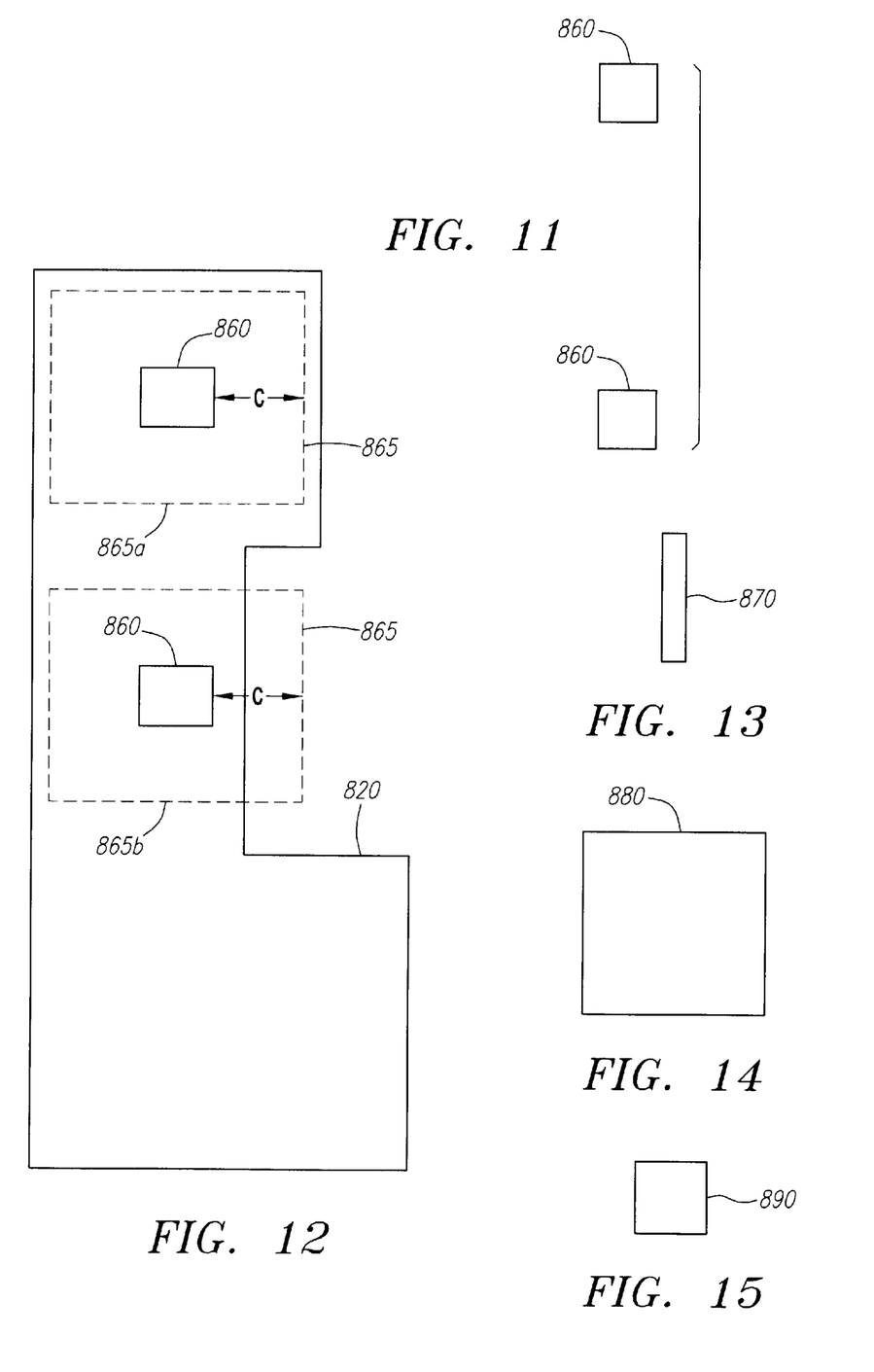
FIG. 11 is a diagram illustrating only the selected problematic vias from FIG. 8, returned to their original size.
FIG. 12 is a diagram illustrating only the selected problematic vias from FIG. 8, along with the metal area, wherein the vias are extended again by another extension distance.
FIG. 13 is a diagram illustrating only one of the problematic enclosure vias of FIG. 12, with the metal area subtracted.
FIG. 14 is a diagram illustrating the same selected enclosure via of FIG. 13, but returned to its extended dimensions before subtraction of the metal area.
FIG. 15 is a diagram illustrating the same selected enclosure via of FIG. 13, returned to its original size.

In a next step 510, those expanded vias 830 that have material remaining outside the metal area 820 are identified. In the present example, expanded vias 830a and 830b would be identified in step 510 as of interest, while expanded via 830c would be ignored. In a next step 511, the original dimensions for the potentially problematic vias 830a and 830b are recovered. This may be accomplished in any of a variety of ways—for example, by subtracting the distance C1 from each of the edges of the vias 830a, 830b, thereby returning expanded vias 830a, 830b to their original sizes. Alternatively, the original dimensions of the potentially problematic vias 830a and 830b may be recovered by applying a "geomButtOrOver" function (which identifies all of the shapes of a first layer that abut or overlap a second layer), as described later herein, to obtain the sized vias, and then a "geomAND" function (similar to a logical AND operation between layers A and B), as described later herein, to obtain the original vias. FIGS. 10 and 11 depict the potentially problematic, expanded vias 850, and the potentially problematic vias 860 returned to their original sizes. At this point, the sub-process 520 has selected a set of potentially problematic vias, the identities of which may be stored in a table or other data structure within a temporary file maintained as part of the verification process being executed on the physical layout file 401 (or 501, as shown in FIG. 5).

Steps 530, 540, 531 and 532 in FIG. 5 are analogous to steps 405, 410, 406 and 407, respectively, appearing in FIG. 4.

Figure 6:
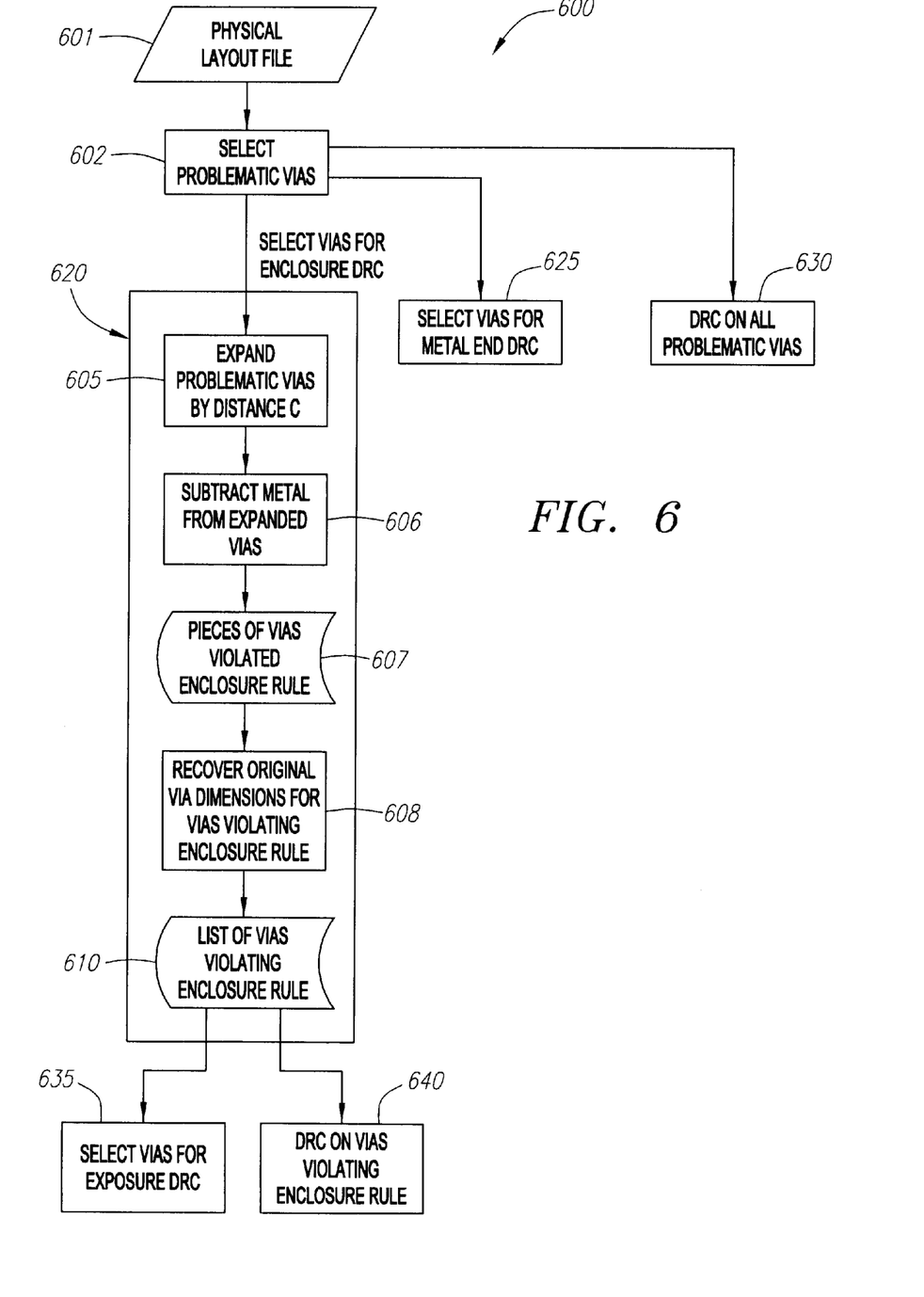
FIG. 6 is a process flow diagram in accordance with a preferred metal end, enclosure and exposure checking process as disclosed herein, showing specific steps for selecting potentially problematic vias for an enclosure design rule check, in general accordance with the process of FIG. 4.

FIG. 6 illustrates a preferred sub-process 620 for selecting potentially problematic vias for an enclosure design rule check, in connection with a preferred process 600 for selecting and processing vias that are likely to have metal end, enclosure and/or exposure violations. As illustrated in FIG. 6, sub-process 620 for selecting potentially problematic vias for an enclosure design rule check comprises a first step 605 of expanding the potentially problematic vias 860 previously identified by a predetermined expansion distance C, resulting in expanded vias 865. This step is illustrated graphically in FIG. 12 for the example explained previously with respect to FIGS. 8 through 11. In a next step 606, the metal area 820 is subtracted from the expanded vias 865, resulting in a residual portion 870 as illustrated in FIG. 13. In a next step 607, the vias that have material remaining after the metal area subtraction are identified. In the present example, expanded via 865b would be identified in step 607, while expanded via 865a would be ignored. In step 607, the residual portions 870 associated with the expanded vias violating the enclosure rule (i.e., expanded via 865b) are returned to their expanded dimension before the most recent metal area subtraction, as illustrated in FIG. 14. In a next step 608, the expanded vias violating the enclosure rule are returned to their original, un-expanded, size, illustrated by the via 890 in FIG. 15 corresponding to an un-expanded version of expanded via 880 in FIG. 14 (i.e., expanded via 865b in FIG. 12). In a next step 610, a list of the vias violating the enclosure design rule (that is, being too close to a metal edge) are output for further processing.

In step 640, an enclosure design rule check is performed on all vias determined in sub-process 620 as violating the enclosure rule, and the results stored or output to a subsequent process. However, a metal end enclosure design rule check is not needed, and is preferably not performed, on the vias not violating the enclosure design rule—that is, on those vias not considered to be "too close" to a metal edge.

Steps 602, 625, 630 and 635 in FIG. 6 are analogous to steps 402, 406, 407 and 410 respectively, appearing in FIG. 4.

Figure 7:
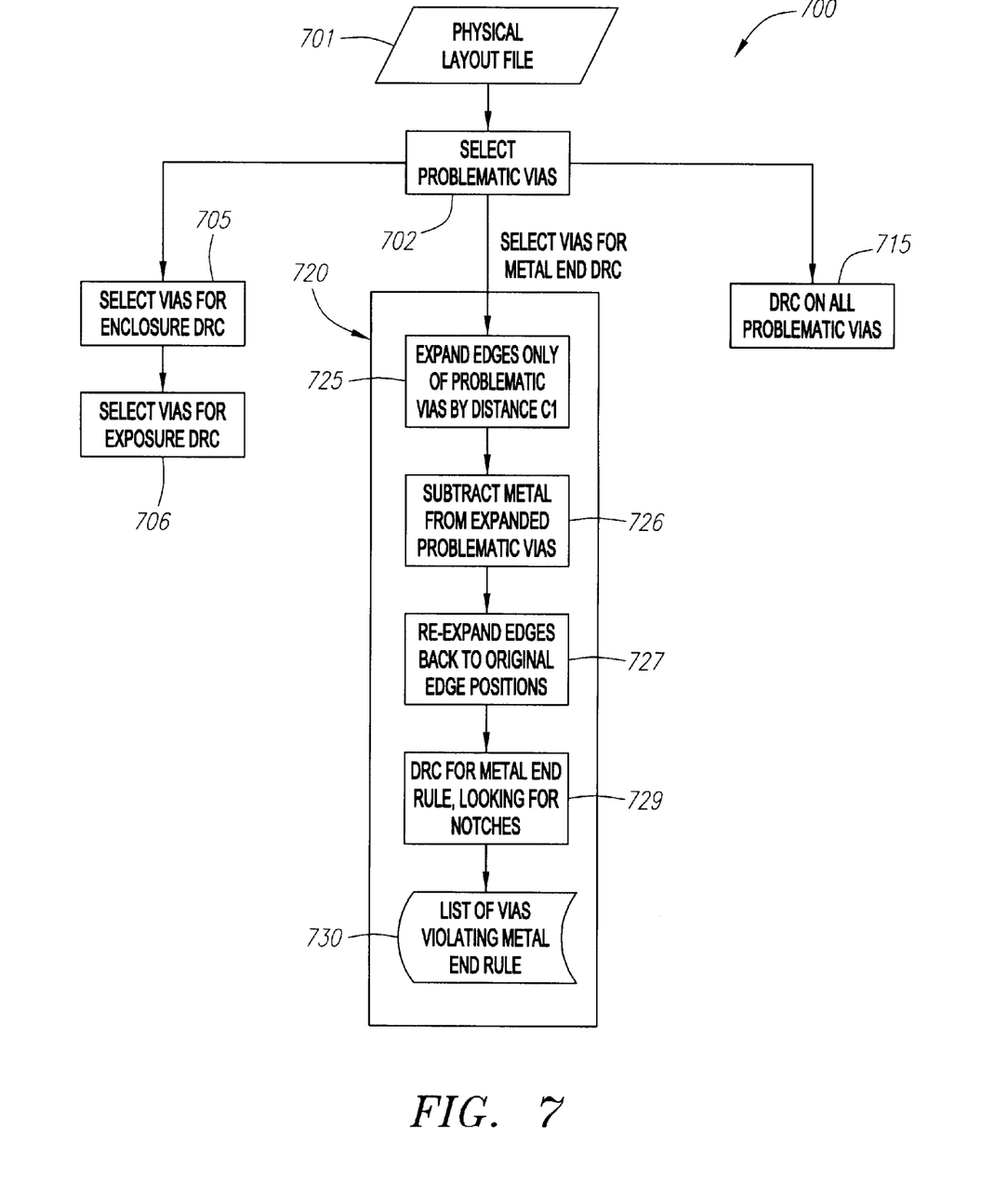
FIG. 7 is a process flow diagram in accordance with a preferred metal end, enclosure and exposure checking process as disclosed herein, showing specific steps for selecting potentially problematic vias for a metal end design rule check, in general accordance with the process of FIG. 4.
Figure 16:
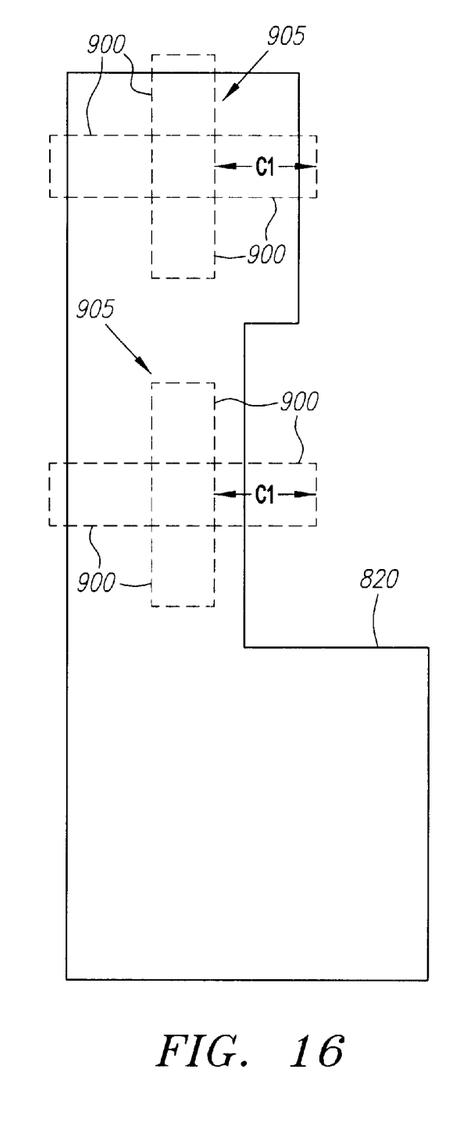
FIG. 16 is a diagram illustrating the selected problematic vias from FIG. 8, with their edges only extended by a distance C1.
Figure 17:
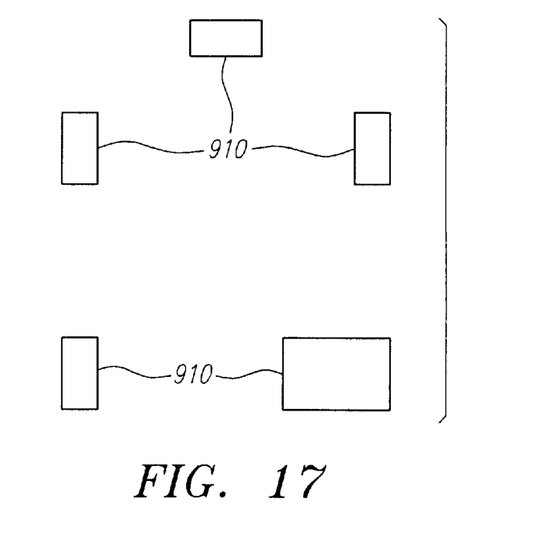
FIG. 17 is a diagram illustrating the selected problematic vias from FIG. 8, with their edges only extended by a distance C1, and with the metal area subtracted.

FIG. 7 illustrates a preferred sub-process 720 for selecting potentially problematic vias for a metal end design rule check, in connection with a preferred process 700 for selecting and processing vias that are likely to have metal end, enclosure and/or exposure violations. As illustrated in FIG. 7, sub-process 720 for selecting potentially problematic vias for a metal end design rule check comprises a first step 725 of expanding the edges of the potentially problematic vias 860 previously identified (for example, by the sub-process 520 illustrated in FIG. 5) straight out by a predetermined expansion distance C1, without expanding the corner portions thereof, resulting in expanded vias 905, as illustrated graphically in FIG. 16 (for the example explained previously with respect to FIGS. 8 through 11). In a next step 726, the metal area 820 is subtracted from the expanded vias 905, resulting in residual portions 910 as illustrated in FIG. 17. In a next step 727, the vias that have residual portions 910 remaining after the metal area subtraction are identified. It then generates rectangular shapes 930 by pushing in the predetermined expansion distance, C1, from the from the outer edges 911 of the residual portions 910, resulting in a set of rectangular shapes 930 for some but not all of the expanded sides of the original vias 860. In a next step 729, a design rule check is run on these vias, searching for particular features such as "L" shaped notches 920, which would indicate a violation of the metal end design rule. A list of the vias violating the metal end design rule (that is, being too close to a metal edge) may be output for further processing.

Steps 702, 705, 706 and 715 in FIG. 6 are analogous to steps 402, 405, 410 and 415 respectively, appearing in FIG. 4.

In one aspect, the process 400, 500, 600 or 700 selects the vias likely to cause problems from among all of the vias in the physical layout file. The process then selects those vias that violate the enclosure rule and performs a design rule check for enclosure violations on the identified vias; performs a design rule check for metal end violations on the potentially problematic vias; and performs an exposure check on the potentially problematic vias.

Various embodiments as described herein are capable of greatly reducing (for example, by a factor of 100) the time required for checking metal ends, enclosure and exposure of the vias in a physical layout file for a circuit design. The memory requirements for performing such design checks are likewise significantly reduced. By selecting and processing only those vias that are within a specified distance from the edge of the metal, the speed of design rule checks can be dramatically increased.

One embodiment of the invention is exemplified in the following programming instructions, written in a format that can be interpreted by the Assura™ software verification package commercially available from Cadence Design Systems, Inc. of San Jose, Calif.:

Line 1 v4__9s=geomSize (vi4 0.09)
Line 2 v4__m4=geomAndNot (v4__9s m4)
Line 3 v4__m4_bo=geomButtOrOver (v4__9s v4__m4)
Line 4 v4__me4=geomAnd (v4__m4_bo vi4)
Line 5 v4__2s=geomSize (v4__me4 0.02)
Line 6 v4m4=geomAndNot (v4__2s m4)
Line 7 v4m4_bo=geomButtOrOver (v4__2s v4m4)
Line 8 v4__enc=geomAnd (v4m4_bo v4__me4)
Line 9 v4el__63__0=drc (m4 v4__enc enc<0.02)
Line 10 errorLayer (v4el__63__0 "M4 overlap V4>=0.02 um. VI4.E.1")
Line 11 v4m4__9s=geomSize (v4__me4 0.09 edges)
Line 12 v4m4e=geomAndNot (v4m4__9s m4)
Line 13 v4m4e__bo=geomButtOrOver (v4m4__9s v4m4e)
Line 14 v4e2=drc (v4m43_bo sepNotch<0.05)
Line 15 errorLayer (v4e2 "M4 overlap V4 at End>=0.09 um. VI4.E.2.")
Line 16 v4b1=geomAndNot (v4__enc m4)
Line 17 errorLayer (v4b1 "V4 must be covered BY M4.")

A computer system may be configured, in the context of a electronic design automation system, to execute the above programming instructions in connection with specific design rule decks and operate upon a physical layout file that has been generated as a result of the electronic design process.

By way of explanation, the task "geomsize" is used to size a polygon or shape. The sizing function could increase the size of the polygon or shape if the units are positively; similarly, it could decrease the size of the polygon or shape if the units are negative. An example of sizing is as follows:

v4__9s=geomSize (via4 0.09)

According to the above example, the via4 shape is grown outwards by 0.09 microns.

The task "geomAndNot" represents a difference (i.e., A–B) expression. For example, if MetalA and MetalB are two metal layers, then the following expression yields a resultant layer Y that contains all the shapes of A that do not overlap with any shapes of B:

Y=geomAndNot (A B)

The task "geomAnd" is a straightforward AND or union operation. This task provides the common overlapping region of two layers. For example, the following expression yields a resultant layer Y that contains all of the common overlapping regions of A and B:

Y=geomAND (A B)

The task "geomButtOrOver" identifies all the shapes of a first layer (e.g., layer A) that abut with or overlap a second layer (e.g., layer B). For example, the following expression yields a resultant layer Y that identifies all the shapes of layer A that touch or overlap with shapes in layer B:

Y=geomButtOrOver (A B)

The "drc" task is a design rule checking function that may be utilized to check the design rule integrity of a physical layout file. The enclosure design rule check measures the enclosure of shapes in a first layer (e.g., layer B) by the shapes on a second layer (e.g., layer A). This measurement represents the distance between the inside-facing edges of shapes on layer A to the outside facing edges of shapes on layer B. In other words, the enclosure design rule check determines of a layer A shape encloses a layer B shape, and by how much. For example, the following expression checks for all shapes on layer A and enclose shapes on layer B, with enclosure limits of greater than 0 but less than 4:

Y=drc (layerA layerB 0<enc<4)

Execution of Lines 1 through 4 of the aforementioned programming instructions, when incorporated into a design rule deck, generally causes the computer system to filter out, from a physical layout file, the vias that are likely to cause problems, in general accordance with the steps depicted in FIG. 5. Lines 5 through 8 select those vias that violate the enclosure rule, in general accordance with the steps set forth in FIG. 6. Line 9 carries out a design rule check (DRC) for enclosure violations on the output of Line 8, as suggested, for example, by step 640 of FIG. 6. Line 10 outputs the results of the design rule check carried out in Line 8. Lines 11 through 14 perform a design rule check (DRC) for metal end violations on the output of Line 5, in general accordance with the steps set forth in FIG. 7. Line 15 outputs the results of the design rule check carried out in Lines 11 through 14. Line 16 performs an exposure check on the output of Line 8, and Line 17 outputs the results thereof.

In more detail Lines 1 through 4 of the aforementioned program select the vias that are likely to have enclosure, metal end and/or exposure violations, as discussed earlier with respect to sub-process 520 in FIG. 5. Lines 1 through 4 of the program select only those vias that are within a certain predetermined distance, C1, of an edge of the metal area 820 (see FIG. 8). Line 1 expands the outside edges of all vias 800 by the distance C1. Line 2 subtracts the area of the metal 820 from the expanded vias 830, leaving only those portions 840 of the expanded vias 830 that were outside of the metal area 820 (see FIG. 9). Line 3 identifies those vias 830a, 830b that have material remaining after subtraction of the metal area 820, while ignoring the vias (such as via 830c) not having any material remaining after the subtraction. It then returns those vias to their expanded dimension before the metal area subtraction 860. Line 4 returns those vias 830a, 830b to their original, un-expanded, size.

Line 5 through 8 provide an enclosure design rule check. Line 5 expands the outside edges of the selected vias 860 by the distance, C, as illustrated in FIG. 12. Line 6 subtracts the metal area 820 from the expended vias, as illustrated in FIG. 13. Line 7 identifies those expanded vias 865 that have material remaining 870 after the metal area subtraction, and returns those vias to their expanded dimension before the most recent metal area subtraction, as illustrated in FIG. 14. Line 8 returns those vias to their original, un-expanded, size, as illustrated in FIG. 15. Line 9 runs a design rule check on these vias violating the enclosure rule. Line 10 outputs the results of the design rule check.

Figure 18:
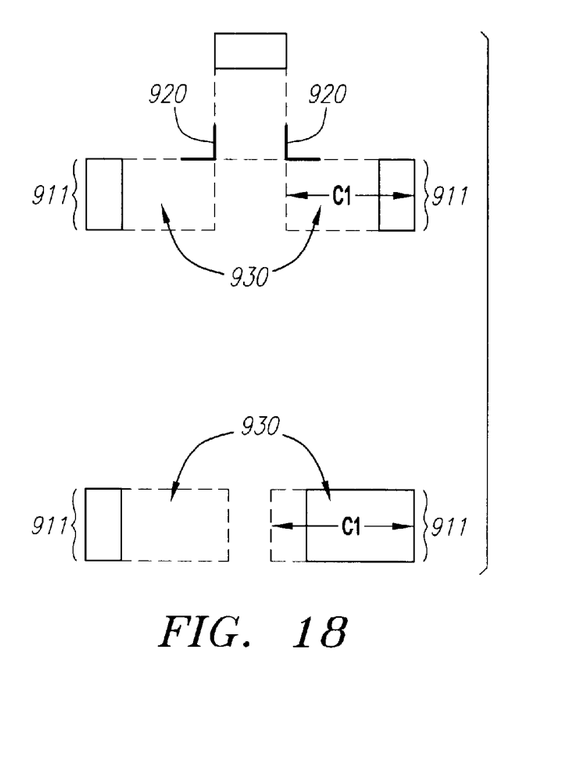
FIG. 18 is a diagram illustrating the selected problematic vias from FIG. 8, with their edges only extended by a distance C1, and with the metal area subtracted, and with the edges expanded inward to their original locations.

Lines 11 to 15 perform a metal end check. Line 11 expands the outside edges of the potentially problematic vias (as identified by Line 4) by the distance C1. However, unlike the previous expansion, Line 11 merely expands the edge lines straight out, without expanding the corners, as illustrated in FIG. 16. Line 12 subtracts the metal area 820 from the expanded vias 905, as illustrated in FIG. 17. Line 13 identifies those expanded vias 905 that have portions 910 remaining after the metal area subtraction, and expands their outermost edges inwards by the distance C1, as illustrated in FIG. 18. Line 14 runs a design rule check on these vias to identify peculiar features, such as "L" shaped notches 920 (see FIG. 18), which would indicate violation of the metal end rule. Line 15 outputs the results of the metal end check process. Lines 16 and 17 perform exposure checking. Line 16 checks for exposed vias from those vias violating the enclosure rule (i.e., output from Line 8). Line 17 outputs the results of the exposure design rule check.

It will be apparent to those skilled in the art that many equivalent ways of performing the functions of the "geomSize", "geomAndNot", "geomButtOrOver", and "geomAND" tasks could be implemented without altering the basic functionality or departing from the principles of the overall methods and systems for selecting and processing potentially problematic vias described herein. Likewise, other types of criteria may be used for selecting potentially problematic vias in advance of performing design rule checks, based upon the same or similar principles of determining the proximity of the vias in a physical layout file to borders or edges of the metal wires and features to which the vias are connected, without departing from the novel principles set forth herein.

While preferred embodiments of the invention have been described herein, many variations are possible which remain within the concept and scope of the invention. Such variations would become clear to one of ordinary skill in the art after inspection of the specification and the drawings. The invention is therefore not to be restricted except within the spirit and scope of any appended claims.

What is claimed is:

1. In an electronic design automation system, a method for performing design rule checks on a physical layout file, the method comprising the steps of:

receiving a physical layout file of a circuit design, said physical layout file comprising physical layout diagram of the circuit design including a metal layer and vias;

identifying a subset of potentially problematic vias from among all vias in the physical layout diagram for performing design rule checks for one or more of metal end violations, enclosure violations, and exposure violations; and performing said design rule checks on the subset of potentially problematic vias.

2. The method of claim 1, wherein said step of identifying said subset of potentially problematic vias from among all vias in the physical layout diagram for performing design rule checks comprises the step of identifying vias in the physical layout diagram within a predetermined minimum distance of metal borders.

3. The method of claim 2, wherein said step of identifying vias in the physical layout diagram within said predetermined minimum distance of metal borders comprises the steps of expanding all of the vias in the physical layout diagram by the predetermined minimum distance to generate a plurality of expanded vias corresponding to said vias, and determining whether metal end violations, enclosure violations or exposure violations exist by comparing said expanded vias to metal wires or metal areas to which said vias are connected.

4. In an electronic design automation system, a method for selecting potentially problematic vias on which one or more of metal end, enclosure, and exposure design rule checks will be performed, the method comprising the steps of:

receiving a physical layout file containing a description of a physical layout diagram of a circuit design, said physical layout diagram comprising a plurality of vias;

expanding said vias in the physical layout diagram by a first minimum distance required for clearance between vias and metal line ends or by a second minimum distance required for clearance between vias and metal edges, whichever distance is greater, thereby generating a plurality of expanded vias;

subtracting from the expanded vias areas of metal covered by the expanded vias; and selecting, as potentially problematic vias for design rule checks or further screening, those vias corresponding to expanded vias with area remaining after subtraction of the areas of metal covered by the expanded vias.

5. The method of claim 4, wherein said step of subtracting from the expanded vias areas of metal covered by the expanded vias comprises the step of applying a logical "And Not" function to the expanded vias and the metal areas, in such a way as to select the area of the expanded vias and not the metal areas.

6. The method of claim 4, wherein said expanded vias are returned to their original geometric size prior to design rule check processing.

7. The method of claim 4, further comprising the step of performing design rule checks on said potentially problematic vias.

8. The method of claim 4, further comprising the steps of:

expanding said potentially problematic vias by a third minimum distance required for clearance between vias and edges of metal enclosures, thereby generating a second plurality of expanded vias;

subtracting from the second plurality of expanded vias areas of metal covered by the second plurality of expanded vias; and selecting, as potentially problematic vias for design rule checks relating to enclosure rule violations, only those vias corresponding to the second plurality of expanded vias having area remaining after subtraction of the areas of metal covered by the second plurality of expanded vias.

9. The method of claim 8, wherein said potentially problematic vias for design rule checks relating to enclosure rule violations are returned to their original geometric size prior to design rule check processing relating to enclosure rule violations.

10. The method of claim 4, further comprising the steps of:

expanding said potentially problematic vias by a third minimum distance required for clearance between vias and edges of metal ends, thereby generating a second plurality of expanded vias;

subtracting from the second plurality of expanded vias areas of metal covered by the second plurality of expanded vias; and selecting, as potentially problematic vias for design rule checks relating to metal end rule violations, only those vias corresponding to the second plurality of expanded vias having area remaining after subtraction of the areas of metal covered by the second plurality of expanded vias.

11. The method of claim 10, wherein said potentially problematic vias for design rule checks relating to enclosure rule violations are returned to their original geometric size prior to design rule check processing relating to metal end rule violations.

12. In an electronic design automation system, a computer readable medium having stored therein one or more sequences of instructions for selecting potentially problematic vias on which one or more of metal end, enclosure, and exposure design rule checks will be performed, said one or more sequences of instructions causing one or more processors to perform a plurality of acts, said acts comprising:

receiving a physical layout file containing a description of a physical layout diagram of a circuit design, said physical layout diagram comprising a plurality of vias;

expanding said vias in the physical layout diagram by a first minimum distance required for clearance between vias and metal line ends or by a second minimum distance required for clearance between vias and metal edges, whichever distance is greater, thereby generating a plurality of expanded vias;

subtracting from the expanded vias areas of metal covered by the expanded vias; and selecting, as potentially problematic vias for design rule checks or further screening, those vias corresponding to expanded vias with area remaining after subtraction of the areas of metal covered by the expanded vias.

13. The computer readable medium of claim 12, wherein said act of subtracting from the expanded vias areas of metal covered by the expanded vias comprises the act of applying a logical "And Not" function to the expanded vias and the metal areas, in such a way as to select the area of the expanded vias and not the metal areas.

14. The computer readable medium of claim 12, wherein said expanded vias are returned to their original geometric size prior to design rule check processing.

15. The computer readable medium of claim 12, wherein said acts further comprise the act of performing design rule checks on said potentially problematic vias.

16. The computer readable medium of claim 12, wherein said acts further comprise the acts of:

expanding said potentially problematic vias by a third minimum distance required for clearance between vias and edges of metal enclosures, thereby generating a second plurality of expanded vias;

subtracting from the second plurality of expanded vias areas of metal covered by the second plurality of expanded vias; and selecting, as potentially problematic vias for design rule checks relating to enclosure rule violations, only those vias corresponding to the second plurality of expanded vias having area remaining after subtraction of the areas of metal covered by the second plurality of expanded vias.

17. The computer readable medium of claim 16, wherein said potentially problematic vias for design rule checks relating to enclosure rule violations are returned to their original geometric size prior to design rule check processing relating to enclosure rule violations.

18. The computer readable medium of claim 12, wherein said acts further comprise the acts of:

expanding said potentially problematic vias by a third minimum distance required for clearance between vias and edges of metal ends, thereby generating a second plurality of expanded vias;

subtracting from the second plurality of expanded vias areas of metal covered by the second plurality of expanded vias; and selecting, as potentially problematic vias for design rule checks relating to metal end rule violations, only those vias corresponding to the second plurality of expanded vias having area remaining after subtraction of the areas of metal covered by the second plurality of expanded vias.

19. The computer readable medium of claim 18, wherein said potentially problematic vias for design rule checks relating to enclosure rule violations are returned to their original geometric size prior to design rule check processing relating to metal end rule violations.

20. In an electronic design automation system wherein a physical layout file is received for design rule check processing, said physical layout file specifying connectivity between a plurality of vias and metal areas of a circuit design, a method for selecting a set of potentially problematic vias among all of said vias, said method comprising the steps of:

identifying vias within a predetermined minimum distance of metal borders of the metal areas to which said vias are connected; and performing design rule checks only on the identified vias for one or more of metal end violations, enclosure violations, and exposure violations.

21. The method of claim 20, wherein said step of identifying vias within said predetermined minimum distance of metal borders of the metal areas to which said vias are connected comprises the steps of expanding all of the vias in the physical layout diagram by the predetermined minimum distance to generate a plurality of expanded vias corresponding to said vias, subtracting said metal areas from the expanded vias, and determined whether any portion of the metal areas remains after said subtraction.

* * * * *

UNITED STATES PATENT AND TRADEMARK OFFICE
CERTIFICATE OF CORRECTION

PATENT NO. : 6,536,023 B1
DATED : March 18, 2003
INVENTOR(S) : Muni B S Mohan and Kevin E Moynihan It is certified that error appears in the above-identified patent and that said Letters Patent is hereby corrected as shown below:

Column 14,
Line 42, please replace "determined" with -- determining --.

Signed and Sealed this

First Day of June, 2004

JON W. DUDAS
*Acting Director of the United States Patent and Trademark Office*